(12) United States Patent
Herner

(10) Patent No.: US 7,276,403 B2
(45) Date of Patent: Oct. 2, 2007

(54) SELECTIVE OXIDATION OF SILICON IN DIODE, TFT, AND MONOLITHIC THREE DIMENSIONAL MEMORY ARRAYS

(75) Inventor: S. Brad Herner, San Jose, CA (US)

(73) Assignee: Sandisk 3D LLC, Milpitas, CA (US)

( * ) Notice: Subject to any disclaimer, the term of this patent is extended or adjusted under 35 U.S.C. 154(b) by 0 days.

(21) Appl. No.: 11/237,162

(22) Filed: Sep. 28, 2005

(65) Prior Publication Data
US 2006/0024868 A1    Feb. 2, 2006

Related U.S. Application Data

(62) Division of application No. 10/742,204, filed on Dec. 18, 2003, now Pat. No. 6,951,780.

(51) Int. Cl.
*H01L 21/84* (2006.01)
(52) U.S. Cl. ............... 438/151; 438/265; 438/287
(58) Field of Classification Search ............ 438/151, 438/265, 287
See application file for complete search history.

(56) References Cited

U.S. PATENT DOCUMENTS

| | | | | |
|---|---|---|---|---|
| 6,034,882 | A * | 3/2000 | Johnson et al. | 365/103 |
| 6,133,150 | A * | 10/2000 | Nakajima et al. | 438/694 |
| 6,197,702 | B1 * | 3/2001 | Tanabe et al. | 438/773 |
| 6,245,605 | B1 * | 6/2001 | Hwang et al. | 438/216 |
| 6,323,115 | B1 * | 11/2001 | Tanabe et al. | 438/592 |
| 6,525,953 | B1 * | 2/2003 | Johnson | 365/63 |
| 6,534,401 | B2 * | 3/2003 | Joo et al. | 438/653 |
| 6,541,312 | B2 * | 4/2003 | Cleeves et al. | 438/131 |
| 6,831,314 | B2 * | 12/2004 | Higo et al. | 257/295 |
| 6,853,049 | B2 * | 2/2005 | Herner | 257/529 |
| 2004/0002186 | A1 * | 1/2004 | Vyvoda et al. | 438/237 |

OTHER PUBLICATIONS

Ahn, Tae-Hang, et al., "Selective oxidation behavior of W/WN/polycrystalline-Si1-xGex gate structure in H2O+H2 ambient", Applied Physics Letters vol. 82, No. 18, (May 5, 2003), 3011-3013.*
Liu, Yong, et al., "Selective Oxidation of Silicon (100) vs. Tungsten Surfaces by Steam in Hydrogen", Journal of the Electrochemical Society, 150 (10), (2003), G597-G601.*
Roters, et al., "Selective Oxidation of Tungsten-Gate Stacks in High Volume DRAM Production", Proceeding, 203rd Meeting of the Electrochemical Society, Paris 2003, Advanced short-time thermal processing for Si based CMOS devices, (2003), 6 pgs., no numbers.*

* cited by examiner

*Primary Examiner*—Trung Dang
(74) *Attorney, Agent, or Firm*—Vierra Magen Marcus & DeNiro LLP

(57) ABSTRACT

The present invention relates to use of selective oxidation to oxidize silicon in the presence of tungsten and/or tungsten nitride in memory cells and memory arrays. This technique is especially useful in monolithic three dimensional memory arrays. In one aspect of the invention, the silicon of a diode-antifuse memory cell is selectively oxidized to repair etch damage and reduce leakage, while exposed tungsten of adjacent conductors and tungsten nitride of a barrier layer are not oxidized. In some embodiments, selective oxidation may be useful for gap fill. In another aspect of the invention, TFT arrays made up of charge storage memory cells comprising a polysilicon/tungsten nitride/tungsten gate can be subjected to selective oxidation to passivate the gate polysilicon and reduce leakage.

6 Claims, 7 Drawing Sheets

PRIOR ART

US 7,276,403 B2

SELECTIVE OXIDATION OF SILICON IN DIODE, TFT, AND MONOLITHIC THREE DIMENSIONAL MEMORY ARRAYS

CROSS-REFERENCE TO RELATED APPLICATIONS

This application is a divisional of Herner, U.S. patent application Ser. No. 10/742,204, "Selective Oxidation of Silicon in Diode, TFT, and Monolithic Three Dimensional Memory Arrays," filed Dec. 18, 2003 now U.S. Pat. No. 6,951,780, which is hereby incorporated by reference in its entirety.

BACKGROUND OF THE INVENTION

The invention relates to use of selective oxidation of silicon in memory cells and arrays. Selectively oxidizing silicon while avoiding oxidation of exposed tungsten and tungsten nitride has been used in CMOS devices formed in monocrystalline silicon, as described by Liu et al., "Selective Oxidation of Silicon (100) vs. Tungsten Surfaces by Steam in Hydrogen," Journal of the Electrochemical Society, 150 (10) G597-G601, 2003, hereby incorporated by reference. This technique can be extended to address challenges that arise in diode memory arrays, thin film transistor (TFT) memory arrays, and monolithic three dimensional memory arrays.

SUMMARY OF THE INVENTION

The present invention is defined by the following claims, and nothing in this section should be taken as a limitation on those claims. In general, the invention is directed to use of selective oxidation of silicon in memory cells and arrays.

A first aspect of the invention provides for a method for oxidizing silicon in a memory array, the method comprising oxidizing silicon in the presence of exposed tungsten or tungsten nitride to produce silicon oxide wherein the tungsten or tungsten nitride is substantially not oxidized, and wherein the memory array comprises memory cells, each memory cell comprising a first diode or incipient diode.

Another aspect of the invention provides for a method for forming a thin film transistor, the method comprising providing a first polysilicon film; forming a gate of the thin film transistor over the polysilicon film, the gate comprising silicon and tungsten or tungsten nitride; and oxidizing a portion of the silicon in the presence of a surface of the tungsten or tungsten nitride in conditions that substantially do not oxidize the tungsten or tungsten nitride, wherein the thin film transistor is a memory cell.

Yet another aspect of the invention provides for a method for filling gaps in a memory array, the method comprising forming first memory cells separated by gaps, wherein the memory array comprises silicon, and wherein the first memory cells are formed at a pitch of about 0.18 microns or less; oxidizing a portion of the silicon in the presence of exposed tungsten or tungsten nitride to produce silicon oxide wherein the tungsten or tungsten nitride is substantially not oxidized; and planarizing the silicon oxide to produce a substantially planar surface, wherein, after the planarizing step, the gaps are substantially entirely filled at the planar surface.

An aspect of the invention provides for a monolithic three dimensional memory array comprising a first memory level formed at a first height above a substrate comprising a plurality of memory cells separated by gaps; and a second memory level formed at a second height above the substrate, the second height different from the first height; wherein the memory cells comprise silicon, and a portion of the silicon is oxidized to form silicon oxide at conditions that substantially do not oxidize tungsten or tungsten nitride.

A related aspect of the invention provides for a method for forming a monolithic three dimensional memory array, the method comprising forming a first memory level at a first height above a substrate; forming a second memory level at a second height above the substrate, the second height different from the first height, wherein the first memory level or the second memory level comprises silicon; and oxidizing a portion of the silicon in the presence of exposed tungsten or tungsten nitride, wherein the exposed tungsten or tungsten nitride is substantially not oxidized.

An embodiment of the invention provides for a method for forming a monolithic three dimensional memory array, the method comprising forming a plurality of substantially parallel, substantially coplanar first conductors comprising tungsten or tungsten nitride; forming a plurality of first vertically oriented diodes or incipient diodes comprising silicon over the first conductors; and oxidizing a portion of the silicon in the presence of the exposed tungsten or tungsten nitride wherein the tungsten or tungsten nitride substantially is not oxidized.

Another aspect of the invention provides for a method for forming a nonolithic three dimensional memory array, the method comprising forming a plurality of first conductors comprising tungsten or tungsten nitride; forming a plurality of first vertically oriented diodes comprising silicon over the first conductors; and oxidizing a portion of the silicon by flowing $H_2$ and $H_2O$ in the presence of exposed tungsten, wherein a ratio of partial pressure of $H_2$ to partial pressure of $H_2O$ is at least about 3:1.

Each of the aspects and embodiments of the invention described herein can be used alone or in combination with one another.

The preferred aspects and embodiments will now be described with reference to the attached drawings.

DETAILED DESCRIPTION OF THE INVENTION

Figure 1:
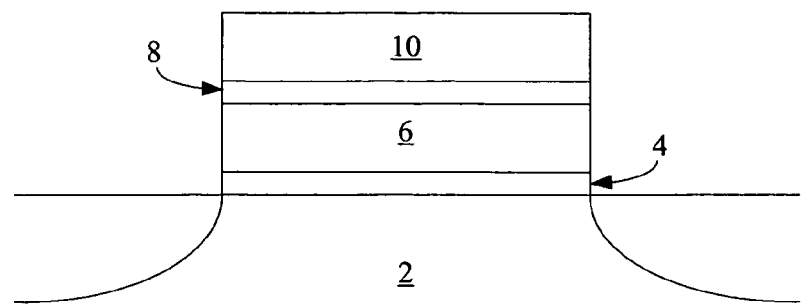
FIG. 1 is a cross-sectional view of a prior art CMOS device.

It is known to use selective oxidation techniques to oxidize silicon in the presence of tungsten in CMOS logic devices. Liu et al., for example, describes a device like the one shown in FIG. 1. In this device, a CMOS transistor is fabricated with a channel region in a monocrystalline silicon wafer surface 2. A gate oxide layer 4 is formed, along with a gate electrode consisting of polycrystalline silicon (herein called polysilicon) layer 6, tungsten nitride barrier layer 8, and tungsten layer 10. To repair etch damage to the polysilicon and to reduce leakage paths in the gate stack, the gate polysilicon layer 6 is oxidized in conditions that will not oxidize the tungsten layer 10 or the tungsten nitride layer 8.

In the present application this selective oxidation method is extended to a variety of memory cells and arrays. Fabrication of monolithic three dimensional memory arrays calls for relatively low temperatures, since each memory level must be able to survive thermal processes employed during creation of subsequent memory levels. This consideration makes tungsten, which can survive relatively high temperatures (as compared to aluminum, for example), an advantageous choice for conductors in such arrays. Selective oxidation thus is of particular utility in monolithic three dimensional memory arrays.

Specifically, aspects of the present invention provide for use of selective oxidation in memory arrays, including diode memory arrays, TFT memory arrays, and monolithic three dimensional memory arrays. In some embodiments, selective oxidation can advantageously be used for gap fill in these arrays when devices are formed at very small pitch.

As described in Liu et al., silicon is oxidized in an atmosphere containing $H_2$ and $H_2O$ in the presence of tungsten and/or tungsten nitride without oxidizing the tungsten or tungsten nitride. This is achieved by maintaining the ratio of partial pressure of $H_2$ and $H_2O$ at a ratio greater than about 3:1. When tungsten or tungsten nitride is oxidized in these conditions, it is immediately reduced with coexisting hydrogen, while silicon remains in an oxidized state. When this discussion describes tungsten and tungsten nitride as "substantially not oxidized," this description includes conditions in which tungsten and tungsten nitride are oxidized and immediately reduced; when the process is complete, substantially no oxide of tungsten or tungsten nitride remains. Liu et al. describe performing this oxidation at temperatures between 950 and 1100 degrees C., but it can be performed successfully, though more slowly, at lower temperatures.

Some specific examples of selective oxidation used in memory cells and arrays will be described. These descriptions will include specific process steps and details of structure, conditions, and materials, but it will be appreciated by those skilled in the art that these steps and details can be altered, supplemented, or omitted while the results still fall within the scope of the invention.

Diode-Antifuse Memory Cell and Array

A semiconductor junction diode, for example a p-n diode or a p-i-n diode, has been paired with a dielectric antifuse layer to form a memory cell, for example in the monolithic three dimensional memory array described in Herner et al., U.S. patent application Ser. No. 10/326,470, "An Improved Method for Making High Density Nonvolatile Memory," filed Dec. 19, 2002, hereby incorporated by reference. In the array described in Herner et al., in preferred embodiments in an unprogrammed cell the antifuse layer separates the diode from a conductor. Such an antifuse-diode memory cell is in an unprogrammed state before the antifuse layer is ruptured and is in a programmed state after antifuse rupture.

The term junction diode is used herein to refer to a semiconductor device with the property of conducting current more easily in one direction than the other, having two terminal electrodes, and made of semiconducting material which is p-type at one electrode and n-type at the other. Examples include p-n diodes and n-p diodes, which have p-type semiconductor material and n-type semiconductor material in contact, and p-i-n and n-i-p diodes, in which intrinsic (undoped) semiconductor material is interposed between p-type semiconductor material and n-type semiconductor material.

Figure 2:
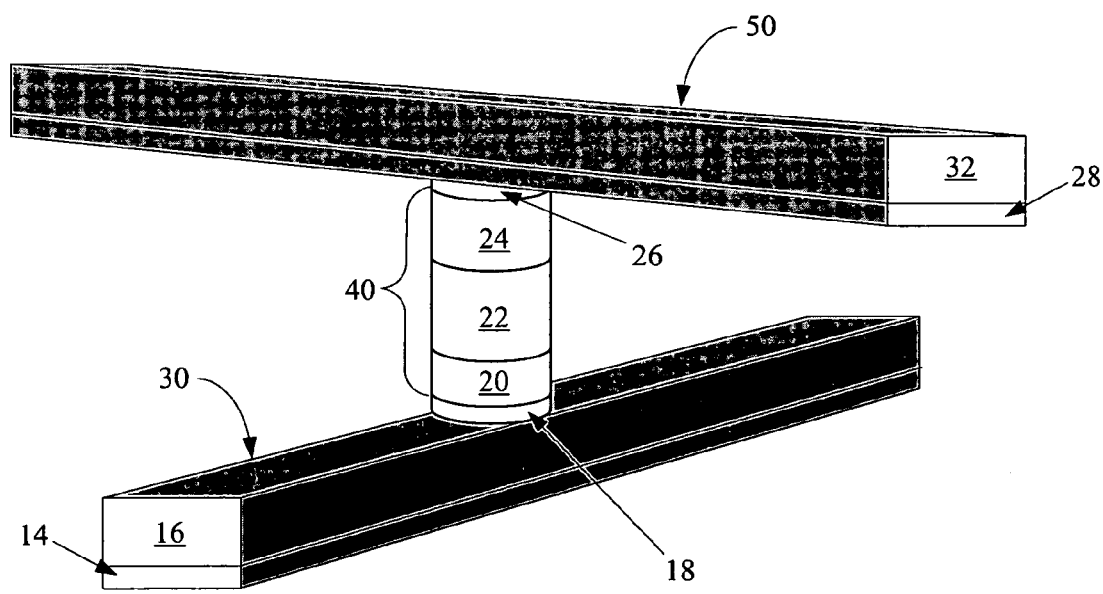
FIG. 2 is a perspective view of a three dimensional memory cell.

A preferred memory cell of Herner et al. includes a vertically oriented junction diode disposed between conductors, the cell further having a dielectric antifuse layer interposed between the junction diode and one of the conductors. A memory cell according to Herner et al. is shown in FIG. 2. A first conductor 30 preferably comprises titanium nitride layer 14 and tungsten layer 16. Junction diode 40 is formed on optional titanium nitride barrier layer 18 and comprises heavily doped semiconductor layer 20 of a first conductivity type, layer 22 which is undoped semiconductor material or lightly doped semiconductor material of a second conductivity type, and heavily doped semiconductor layer 24 of the second conductivity type. A thin silicon dioxide antifuse layer 26 is formed on top of the junction diode 40. Second conductor 50 preferably comprises titanium nitride layer 28 and tungsten layer 32.

In formation of this cell, after patterning of the diodes 40, defects on the silicon surface are believed to be a source of leakage current. Oxidation of this outer surface is an attractive option to passivate the surface and reduce leakage. Oxidizing silicon of the diode 40 using standard thermal oxidation techniques, however, will cause titanium nitride barrier layer 18 and tungsten layer 16 of first conductor 30, portions of which are exposed following diode patterning, to oxidize as well. Oxidation of portions of these layers is destructive to the memory cell.

Selective oxidation techniques can be used to oxidize the silicon of the diode without oxidizing the exposed top surface of tungsten layer 16 of first conductor 30. Selective oxidation also allows silicon to be oxidized without oxidizing tungsten nitride; thus tungsten nitride can successfully be substituted for the titanium nitride of barrier layer 18 to avoid oxidizing its exposed outer surface.

Formation of a junction antifuse memory cell passivated by selective oxidation according to a preferred embodiment of the present invention will be described in detail. This cell is based on the memory cell described in Herner et al. To simplify this description, routine details and alternatives (cleanup steps routinely performed after etch, for example) may be omitted; it will be understood, however, that no relevant teaching of Herner et al. is intended to be excluded.

Figure 3A:
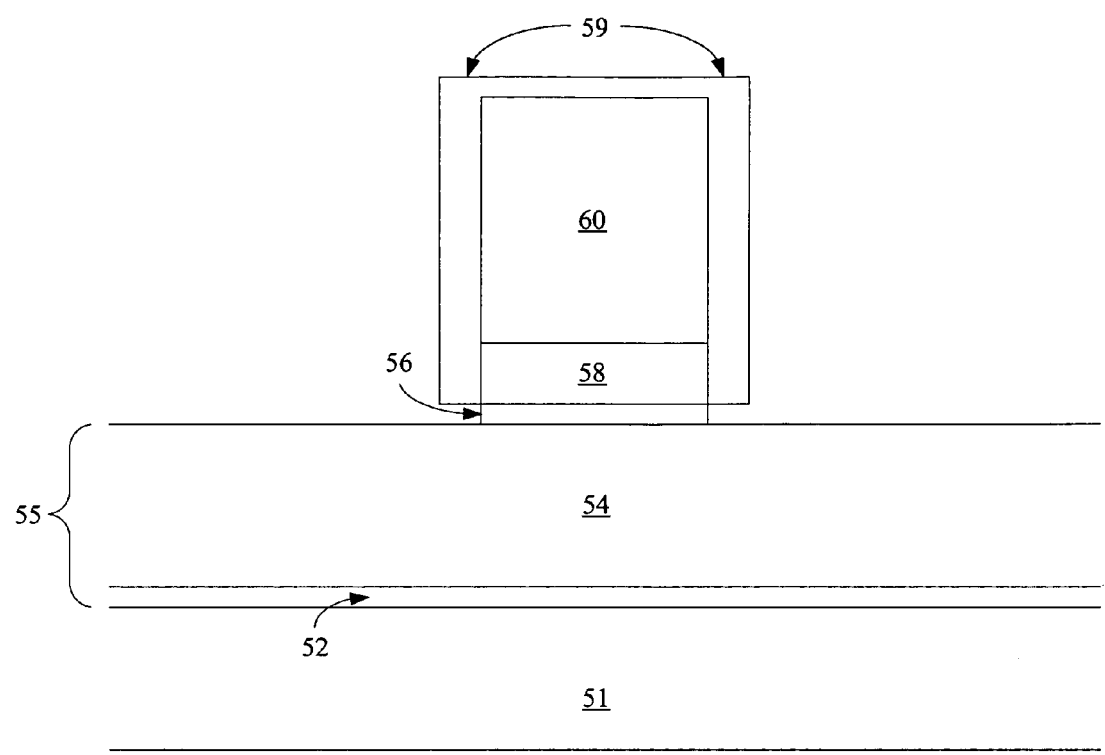
FIGS. 3a and 3b are cross-sectional views describing formation of a memory cell according to the present invention.

Turning to FIG. 3a, fabrication begins over a dielectric layer 51. Dielectric layer 51 can be formed over, for example, a monocrystalline silicon wafer (not shown) or some other suitable substrate. CMOS or other circuitry can be formed in the substrate as desired. Layers of titanium nitride 52 and tungsten 54 are deposited, then patterned and etched to form substantially parallel, substantially coplanar conductors 55, shown extending across the page. Dielectric fill (not shown) is deposited between and over the conductors 55, then planarized, for example by chemical-mechanical polishing (CMP) to expose the top surface of tungsten layer 54 of the conductors 55.

A barrier layer 56, preferably 200 angstroms of tungsten nitride, is formed on the planarized conductors and fill by any conventional method. Next polysilicon is deposited to form layers of a junction diode, for example by chemical vapor deposition. (In the present invention, silicon can either be deposited in polycrystalline form or deposited in amorphous form and crystallized later, for example by subsequent thermal processing.) In this example, a first layer 58 of about 400 angstroms of in-situ doped polysilicon, preferably doped with boron or some other p-type dopant, is deposited to form a p-type polysilicon layer. This first layer 58 is preferably heavily doped. Next about 4300 angstroms of undoped, or intrinsic, polysilicon 60 is deposited. The polysilicon layers 60 and 58 and the thin tungsten nitride layer 56 are patterned and etched to form pillars, each pillar on top of a conductor. Some misalignment can be tolerated.

The patterning step has left exposed the patterned outside surface of the pillar made up of polysilicon layers 60 and 58 and tungsten nitride layer 56, the top surface of tungsten layer 54, and the top surface of the dielectric fill between the conductors 55. (As described in Herner et al., in preferred embodiments an oxide hard mask (not shown) is used in patterning the pillar. The hard mask will be removed in a subsequent planarizing step. If this hard mask is present, the top of the pillar will be covered with oxide and thus will experience little or no oxidation.) The titanium nitride layer 52 at the bottom of the conductors 55 is entirely covered and thus not exposed to the oxidation process.

Next a selective oxidation process is performed in which silicon (the exposed surfaces of polysilicon layers 60 and 58) is oxidized to form silicon oxide layer 59, while tungsten nitride layer 56 and tungsten layer 54 are substantially not oxidized. To achieve this selective oxidation, the ratio of partial pressure of $H_2$ to partial pressure of $H_2O$ should be at least about 3:1. Preferably, between about 30,000 and 7200 sccm, most preferably about 15,000 sccm of $H_2$, and about 700 sccm of $O_2$ are provided. The flow rate of $O_2$ can be increased or decreased as desired, for example from between about 3000 to about 500 sccm, so long as an appropriate ratio to $H_2$ is maintained. $H_2$ and $O_2$ are reacted together in the chamber to form steam ($H_2O$) in situ. The temperature is preferably between about 750 and about 500 degrees C., most preferably about 660 degrees C., while pressure is maintained between about 50 and about 760 Torr, most preferably at about 760 Torr.

The diodes can be formed at different sizes and spacing. Pitch is the center-to-center distance between patterned features; for example from the center of one pillar to the center of an adjacent pillar. As pitch decreases, it becomes increasingly difficult to fill the intervening gaps with dielectric without creating voids. Additional layers will be fabricated on top of the level of diodes just formed; thus reliable gap fill is important.

For very small pitch, for example less than about 0.18 micron, this selective oxidation technique provides additional advantage in that it can be used to achieve gap fill. Silicon oxide formed by the oxidation process has a larger volume than the silicon from which it is derived. Oxidation can be continued until the silicon oxide fills the gap between adjacent diodes.

Figure 4A:
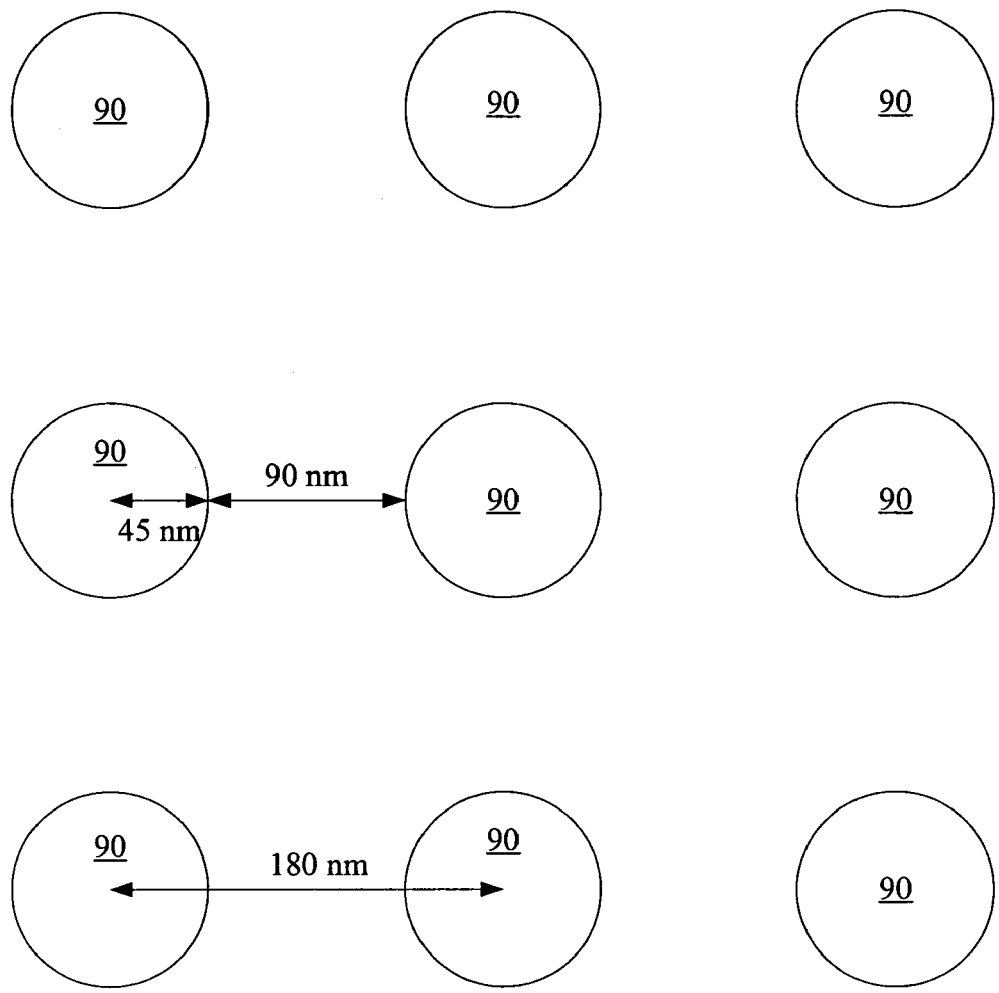
FIGS. 4a and 4b are plan views of diodes in a memory level before and after selective oxidation according to the present invention.
Figure 4B:
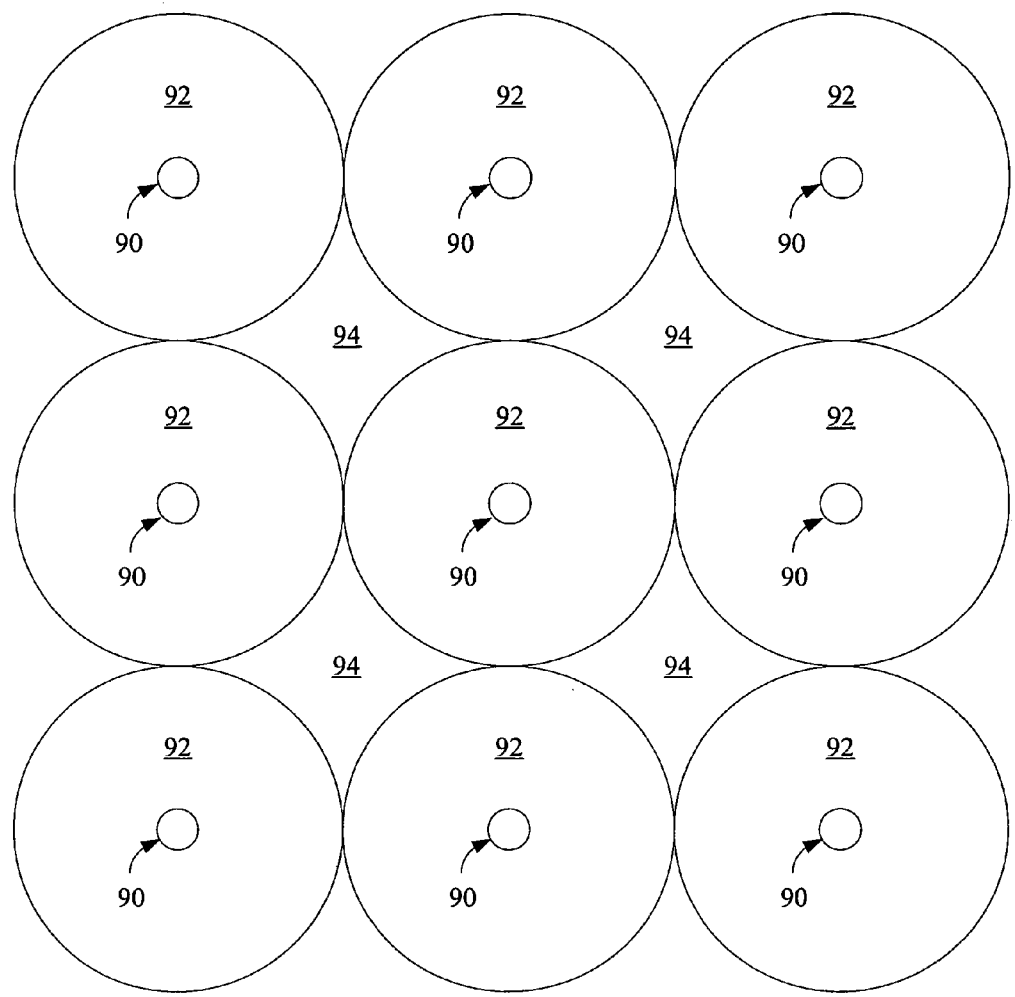

In one exemplary embodiment, shown in FIG. 4a, diodes 90 are formed at a pitch of about 0.18 micron, or 180 nm. The diodes are shown in plan view. The diodes 90 are substantially cylindrical, with a diameter of about 90 nm and thus a radius of about 45 nm. (Due to limitations of photolithography, the corners of polygonal shapes such as rectangles tend to be rounded when patterned at very small pitch. Thus, regardless of the patterned shape, the diodes 90 of this memory array will generally be substantially cylindrical when patterned using standard photolithography tools and methods.) The gap between the diodes is also about 90 nm. Oxidizing about 35 nm of this 45 nm radius according to the selective oxidation methods described herein will produce about 80 nm of silicon oxide 92, as shown in FIG. 4b. After oxidation, the remaining diodes 90 have a radius of about 10 nm (a diameter of about 20 nm.) Minimal further oxidation fills the intervening gaps 94. A diameter of about 20 nm is believed to be adequate to form a reliable device, and may actually afford some advantage in device performance compared to a larger device, most notably in reduced leakage.

Figure 5:
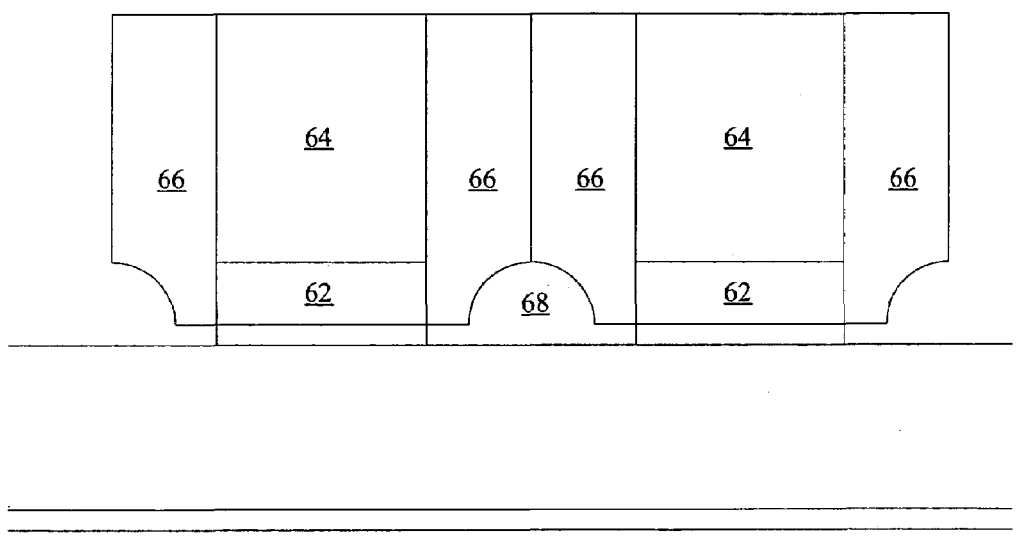
FIG. 5 is a cross-sectional view illustrating differing rates of oxidation according to different dopant levels and types in silicon.

Dopants typically used in silicon to increase its conductivity affect the oxidation rate: p-type dopants increase rate of oxidation, while n-type dopants slow it. Turning to FIG. 5, in one configuration of the diode of Herner et al., the lower, heavily doped polysilicon layer 62 is doped with an n-type dopant, while the upper layer 64 is undoped. As selective oxidation is performed on this cell, the silicon oxide layer 66 forms faster and is thicker in the portion surrounding layer 64 than in the portion surrounding layer 62. When oxidation for gap fill is complete, a gap 68 may remain between layer 62 of adjacent diodes while the gap is entirely filled between layer 64 of adjacent diodes.

To summarize, selective oxidation can be used for passivation, then the gaps filled with a dielectric, for example HDP oxide, according to Herner et al. Alternatively, for devices formed at small pitch, for example about 0.18 micron or less, selective oxidation of the silicon of the diode is continued to fill the gap between adjacent diodes so that no further deposited dielectric is required to fill gaps. For some geometries it may prove advantageous to combine these techniques, using selective oxidation to passivate and fill most of the gaps, then depositing a dielectric to complete gap fill.

Gap fill, whether by selective oxidation, deposition of dielectric fill, or a combination of the two, is followed by planarization, for example by CMP, as in Herner et al., to expose the top of the diode. If selective oxidation is used for gap fill, this planarization involves planarizing the silicon oxide to form a substantially planar surface, wherein, after the planarizing step, the gaps are substantially filled with silicon oxide at the planar surface. As noted, for some diode configurations, there may be a void remaining between lower portions of the diode (as shown in FIG. 5, between n-type layer 62 in adjacent diodes.) So long as the planar surface is sufficient to support formation of subsequent layers, this void can be tolerated without harming the device.

Figure 3B:
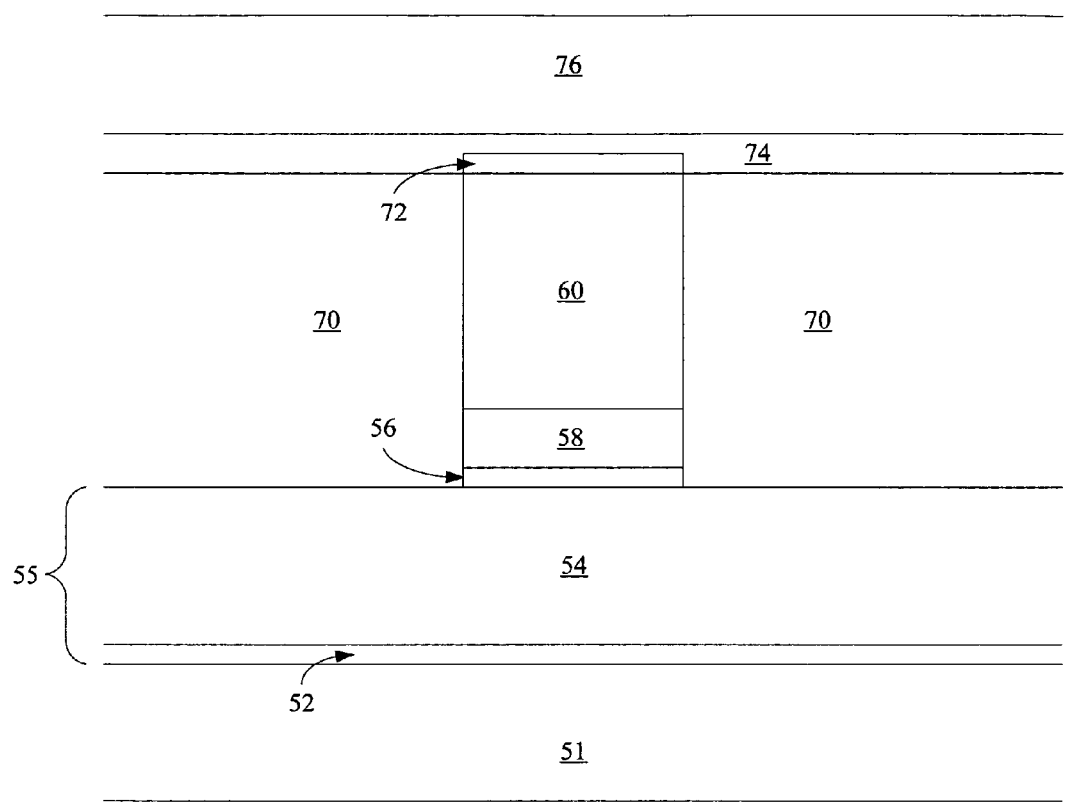

Fabrication continues as in Herner et al.: Turning to FIG. 3b, after planarization, the upper portion of the diode is implanted with n- or p-type dopants (opposite the type of heavily doped layer 58.) Note that dielectric fill 70 between the diodes can be either entirely grown by selective oxidation or can be a combination of a passivation layer grown by selective oxidation and subsequent deposited fill. Silicon oxide layer 59, shown in FIG. 3a, is thus included as part of dielectric fill 70 in FIG. 3b and is not shown separately. A thin antifuse layer 72 is grown, followed by the formation of titanium nitride layer 74 and tungsten layer 76, which will be patterned and etched to form substantially parallel, substantially coplanar top conductors which are preferably substantially perpendicular to the bottom conductors.

Fabrication of a single memory level has been described. Herner et al. describe formation of multiple memory levels to form a monolithic three dimensional memory array. In this case a plurality of second diodes or incipient diodes is formed over the top conductors to form a next memory level. Selective oxidation according to the present invention can be incorporated into some or all of these memory levels.

The selective oxidation techniques described herein can be used in the other embodiments described in Herner et al., including a memory cell with a dielectric antifuse layer formed between diode portions. The diode portions form a diode only after the antifuse is ruptured. Such a device will be referred to as an incipient diode.

A monolithic three dimensional memory array is one in which multiple memory levels are formed (for example by conventional methods such as deposition, PVD, etch, etc.) above a single substrate, such as a wafer, with no intervening substrates. In contrast, stacked memories have been constructed by forming memory levels on separate substrates and adhering the memory levels atop each other, as in Leedy, U.S. Pat. No. 5,915,167, "Three dimensional structure memory." The substrates may be thinned or removed from the memory levels before bonding, but as the memory levels are initially formed over separate substrates, such memories are not true monolithic three dimensional memory arrays.

Petti et al., U.S. application Ser. No. 10/728,230, "Semiconductor Device Including Junction Diode Contacting Contact-Antifuse Unit Comprising Silicide," filed Dec. 3, 2003, hereby incorporated by reference, describes variations on the memory cell and memory array of Herner et al. which include a dielectric antifuse grown on a silicide. Selective oxidation methods as described herein could advantageously be used with any of the embodiments described in Petti et al., substituting tungsten nitride for titanium nitride where appropriate.

In the memory array just described, the memory array comprises a first memory level formed at a first height above a substrate, the first memory level comprising first diodes or incipient diodes, and a second memory level formed above the substrate, the second memory level formed at a second height above the substrate, wherein the second height is different from the first height. The memory array is formed by oxidizing silicon in the presence of exposed tungsten or tungsten nitride to produce silicon oxide wherein the tungsten or tungsten nitride is substantially not oxidized, and wherein the memory array comprises memory cells, each memory cell comprising a diode or incipient diode.

TFT Memory Cells and Arrays

This selective oxidation technique can also be advantageously employed in a TFT memory array. An exemplary TFT memory array formed as a monolithic three dimensional memory array is described in Walker et al., U.S. patent application Ser. No. 10/335,089, "Method for Fabricating Programmable Memory Array Structures Incorporating Series-Connected Transistor Strings," filed Dec. 31, 2002 and hereby incorporated by reference.

The memory cells of Walker et al. are preferably SONOS memory cells, although a floating gate cell could used instead. A SONOS memory cell comprises a channel region conventionally formed of silicon. On and in contact with the channel region is a thin tunneling dielectric layer, typically formed of oxide. A charge storage layer, typically of nitride, is formed in contact with the tunneling oxide layer, and blocking dielectric layer, typically of oxide, is formed on the nitride layer. A gate electrode, typically of polysilicon, is formed on the blocking oxide. These contiguous silicon-oxide-nitride-oxide-silicon layers give the SONOS cell its name. Many variations are possible; for example, the channel region can be formed of any semiconductor material, other dielectric materials can be substituted for any of the oxide or nitride layers, and metal or a polysilicon-metal combination can be used for the gate electrode. The structure can be formed either rightside-up (top gate) or upside-down (bottom gate.) The charge storage layer can be replaced with multiple dielectric films, as in Mahajani et al., U.S. patent application Ser. No. 10/668,693, "Storage Layer Optimization of a Nonvolatile Memory Device," filed Sep. 23, 2003 and hereby incorporated by reference. The presence or absence of stored charge in the charge storage layer distinguishes a programmed cell from an erased cell. Because of the many variations possible, the term SONOS-type cell will refer to a field effect transistor having a channel region, a tunneling dielectric, a charge storage dielectric, a blocking dielectric, and a gate electrode which is capable of storing charge in the charge storage dielectric and functioning as a memory cell. It will be understood that a SONOS-type cell may not have precisely the silicon-oxide-nitride-oxide-silicon structure of a traditional SONOS cell.

Walker et al. provide a detailed description of the formation of an array of such memory cells. A variation of the memory of Walker et al. using the selective oxidation techniques described earlier will be detailed. The explanation is intended to supplement the teaching of Walker et al., not to replace it, and no relevant teaching of Walker et al. is intended to be excluded.

Figure 6A:
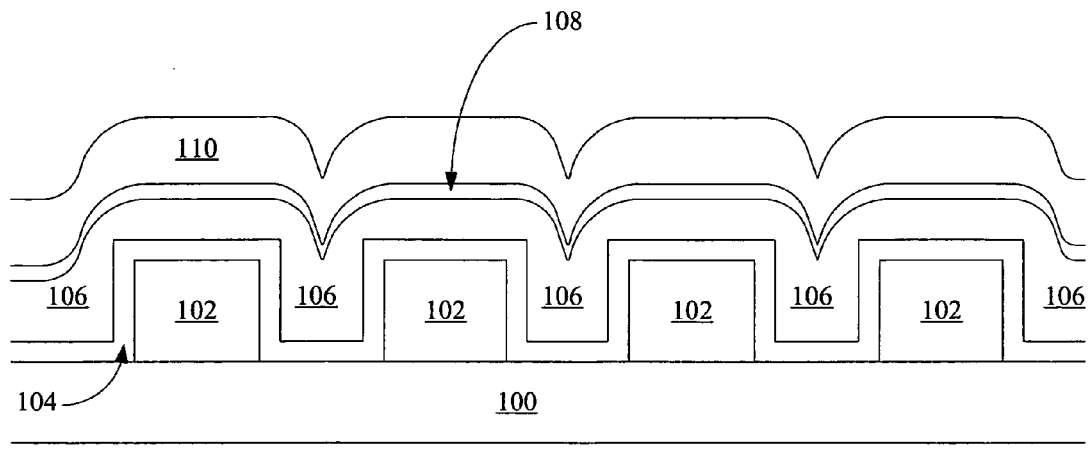
FIGS. 6a and 6b are cross-sectional views, viewed at ninety degrees to each other, of fabrication of a monolithic three dimensional memory array comprising TFT memory cells in which selective oxidation is used according to the present invention.

Turning to FIG. 6a, fabrication begins over a dielectric layer 100. Dielectric layer 100 can be formed over, for example, a monocrystalline silicon wafer (not shown) or some other suitable substrate. CMOS or other circuitry can be formed in the substrate as desired.

Polysilicon layer 102 is deposited on dielectric layer 100, then patterned into substantially perpendicular channel stripes. Polysilicon layer 102 can be undoped or lightly doped with either p-type or n-type dopants. An ONO stack 104, comprising a tunneling oxide layer, a nitride layer, and a blocking oxide layer, is formed on the top and sides of polysilicon layer 102 and on oxide layer 100, as shown in FIG. 6a. Many techniques can be used to form ONO stack 104; in some embodiments the tunneling oxide, which is the bottom oxide in contact with the channel region, is thermally grown silicon oxide, deriving silicon from polysilicon layer 102. In this case, this tunneling oxide layer will exist only in contact with the exposed top and sides of polysilicon layer 102, and will not form on the dielectric layer 100 between the polysilicon channel stripes. The nitride and oxide forming the rest of the ONO stack are deposited over the entire structure.

Various compositions for a gate material layer are taught in Walker et al., including a polysilicon-silicide-polysilicon sandwich and a polysilicon-silicide stack. For use with selective oxidation according to the present invention, a gate material layer comprising a polysilicon-tungsten nitride-tungsten stack will be described. A doped polysilicon layer 106, preferably heavily doped, is conformally deposited on ONO stack 104. A thin tungsten nitride layer 108, for example about 20 angstroms to about 500 angstroms, preferably about 200 angstroms, is formed by any conventional method, for example physical vapor deposition (PVD). A tungsten layer 110 of about 400 angstroms to about 2000 angstroms, preferably about 1000 angstroms, is deposited, for example by PVD, on tungsten nitride layer 108.

Figure 6B:
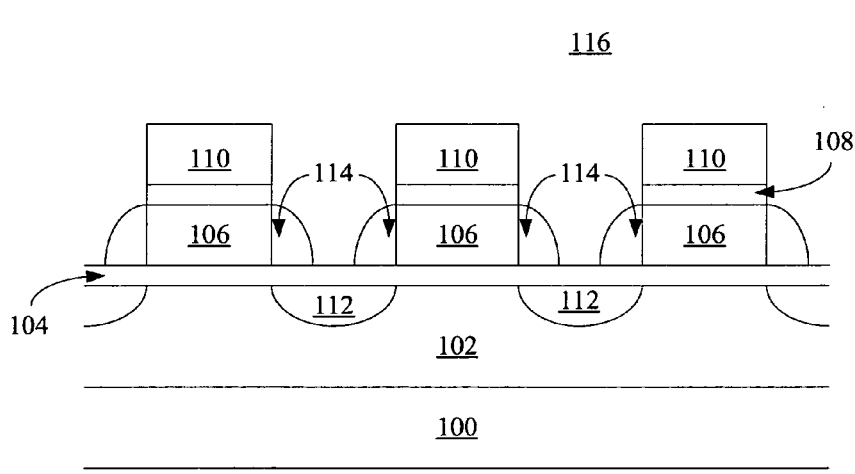

As taught in Walker et al., the gate material layer, in this example comprising polysilicon layer 106, tungsten nitride layer 108, and tungsten layer 110, is patterned and etched into word line stripes which preferably extend substantially perpendicular to the channel stripes patterned earlier. FIG. 6b shows the etched structure, viewed in cross section at ninety degrees from the view of FIG. 6a. After etch, the source and drain regions 112 are implanted using any conventional means.

After pattern and etch of the word line stripes, selective oxidation can be performed to oxidize the polysilicon layer 106 of the exposed sides of the word line stripes, controlling oxidation conditions so that tungsten nitride layer 108 and tungsten layer 110 are not oxidized. As described earlier, to achieve this selective oxidation, the ratio of partial pressure of $H_2$ to partial pressure of $H_2O$ should be at least about 3:1. Preferably, between about 30,000 and 7200 sccm, most preferably about 15,000 sccm of $H_2$, and about 700 sccm of $O_2$ are provided. The flow rate of $O_2$ can be increased or decreased as desired, for example from between about 3000 to about 500 sccm, so long as an appropriate ratio to $H_2$ is maintained. $H_2$ and $O_2$ are reacted together in the chamber to form steam ($H_2O$) in situ. The temperature is preferably between about 750 and about 500 degrees C., most preferably about 660 degrees C., while pressure is maintained between about 50 and about 760 Torr, most preferably at about 760 Torr. Oxidation is preferably continued for about two hours to produce about 100 angstroms of oxide.

If the etch of the word line stripes removed the ONO stack 104 between the word line stripes, exposing polysilicon layer 102 of the channel stripes, oxide will form on polysilicon layer 102 during selective oxidation as well.

The silicon oxide layer 114 formed by this method serves to passivate polysilicon layer 106, removing any etch damage and reducing leakage.

Fabrication continues according to Walker et al. with formation of an interlevel dielectric layer 116 and formation of electrical connections to the channel stripe just formed, which operates as a NAND string, as described in Walker et al. Formation of a single memory level has been described; after planarization of the interlevel dielectric, additional levels can be formed, creating a monolithic three dimensional memory array. The monolithic three dimensional memory array comprises at least a first memory level formed at a first height above the substrate and a second memory level formed at a second height above the substrate, wherein the first height is different from the second height.

In short, the memory level is created by providing a first polysilicon film; forming a gate of the thin film transistor over the polysilicon film, the gate comprising silicon and tungsten and/or tungsten nitride; and oxidizing a portion of the silicon in the presence of a surface of the tungsten or tungsten nitride in conditions that substantially do not oxidize the tungsten or tungsten nitride, wherein the thin film transistor is a memory cell. A thin film transistor memory array comprising a single memory level or multiple memory levels can be formed.

Detailed methods of fabrication have been described herein, but any other methods that form the same structures can be used while the results fall within the scope of the invention.

Additional monolithic three dimensional memories are described in Johnson et al., U.S. Pat. No. 6,034,882, "Vertically Stacked Field Programmable Nonvolatile Memory and Method of Fabrication"; in Johnson, U.S. Pat. No. 6,525,953, "Vertically Stacked Field Programmable Nonvolatile Memory and Method of Fabrication"; Knall et al., U.S. Pat. No. 6,420,215, "Three Dimensional Memory Array and Method of Fabrication"; Lee et al., U.S. patent application Ser. No. 09/927,648, "Dense Arrays and Charge Storage Devices, and Methods for Making Same," filed Aug. 13, 2001; Scheuerlein et al., U.S. application Ser. No. 10/335,078, "Programmable Memory array Structure Incorporating Series-Connected Transistor Strings and Methods for Fabrication and Operation of Same," filed Dec. 31, 2002; and Vyvoda et al., all assigned to the assignee of the present invention and hereby incorporated by reference. Selective oxidation of silicon as described herein could be employed in any of these memory arrays, substituting tungsten nitride for titanium nitride as appropriate.

The foregoing detailed description has described only a few of the many forms that this invention can take. For this reason, this detailed description is intended by way of illustration, and not by way of limitation. It is only the following claims, including all equivalents, which are intended to define the scope of this invention.

What is claimed is:

1. A method for forming a thin film transistor, the method comprising:
    providing a first polysilicon film;
    forming a gate of the thin film transistor over the polysilicon film, the gate comprising silicon and tungsten or tungsten nitride; and
    oxidizing a portion of the silicon in the presence of a surface of the tungsten or tungsten nitride in conditions that substantially do not oxidize the tungsten or tungsten nitride, wherein the thin film transistor is a memory cell.

2. The method of claim 1 wherein the memory cell is a floating gate cell.

3. The method of claim 1 wherein the memory cell is a SONOS-type cell.

4. The method of claim 1 wherein the memory cell is a portion of a first memory level formed at a first height above a substrate.

5. The method of claim 4 wherein the first memory level is a portion of a monolithic three dimensional memory array, the array further comprising a second memory level, the second memory level formed at a second height above the substrate, wherein the second height is different from the first height.

6. The method of claim 1 wherein the oxidizing step comprises flowing $H_2$ and $H_2O$, and wherein a ratio of partial pressure of $H_2$ to partial pressure of $H_2O$ is at least about 3:1.

* * * * *